(12) United States Patent
Ashokan et al.

(10) Patent No.: US 6,657,194 B2
(45) Date of Patent: Dec. 2, 2003

(54) MULTISPECTRAL MONOLITHIC INFRARED FOCAL PLANE ARRAY DETECTORS

(75) Inventors: Renganathan Ashokan, Darien, IL (US); Paul Boieriu, Chicago, IL (US); Yuanping Chen, Rockville, MD (US); Jean-Pierre Faurie, Chicago, IL (US); Sivalingam Sivananthan, Naperville, IL (US)

(73) Assignee: EPIR Technologies, Inc., Bolingbrook, IL (US)

( * ) Notice: Subject to any disclaimer, the term of this patent is extended or adjusted under 35 U.S.C. 154(b) by 159 days.

(21) Appl. No.: 09/834,446

(22) Filed: Apr. 13, 2001

(65) Prior Publication Data

US 2003/0160172 A1 Aug. 28, 2003

(51) Int. Cl.⁷ .............................................. H01L 31/09
(52) U.S. Cl. ................................ 250/338.4; 250/370.13
(58) Field of Search ......................... 250/338.4, 370.13

(56) References Cited

U.S. PATENT DOCUMENTS 5,144,138 A * 9/1992 Kinch et al. ................ 250/332
5,410,168 A    4/1995 Hisa
5,581,084 A * 12/1996 Chapman et al. ......... 250/338.4
5,833,749 A * 11/1998 Moritani et al. ............ 117/101

FOREIGN PATENT DOCUMENTS

JP         2-272766      11/1990

OTHER PUBLICATIONS

W. Kern and D.A. Puotinen, Cleaning solution based on hydrogen peroxide for use in silicon semiconductor technology, RCA Rev. 31, pp. 187–206 (1970).

* cited by examiner

Primary Examiner—Constantine Hannaher
(74) Attorney, Agent, or Firm—Piper Rudnick LLP; Jefferson Perkins

(57) ABSTRACT

At a face of a silicon semiconductor substrate tilted about one degree from a [100] orientation, a readout integrated circuit (ROIC) is implemented, specially designed and fabricated for direct epitaxial growth. Layers of II–VI semiconductor material, preferably including layers of HgCdTe of different bandgaps, are successively and monolithically grown on the face by molecular beam epitaxy (MBE) within a window masking the face and then patterned and wet-etched to create mesas of two-color detector elements in an array. Preferably a beginning buffer layer of CdTe is grown to minimize crystalline mismatch between the Si and the HgCdTe. Sloped sidewalls of the mesas ensure good step coverage of the conductive interconnects from the detector elements to the ROIC.

11 Claims, 9 Drawing Sheets

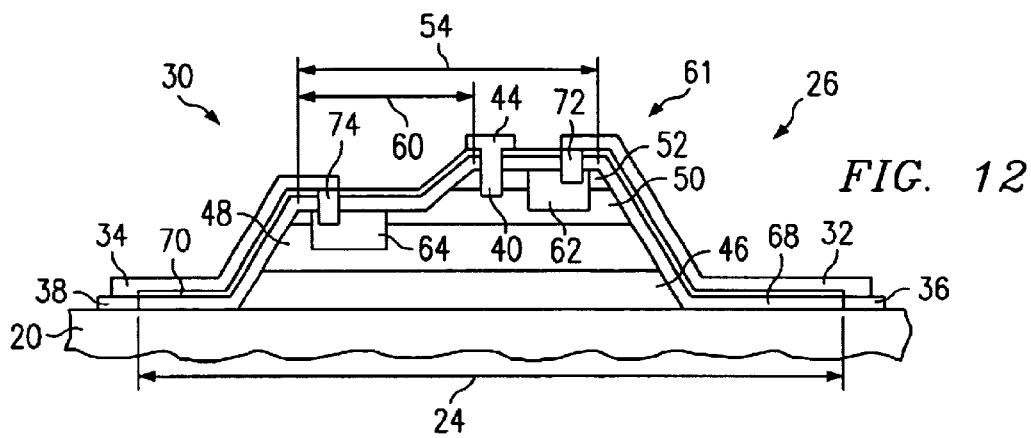
*FIG. 12*
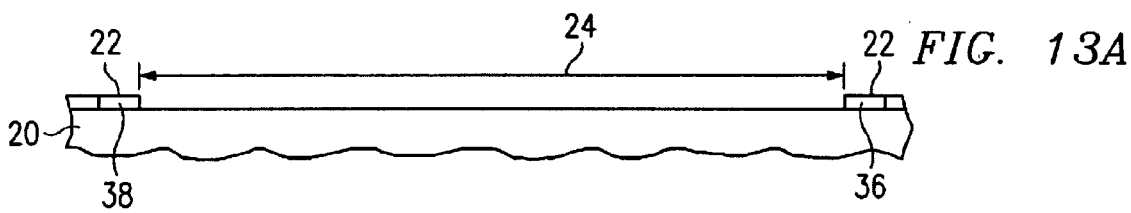
*FIG. 13A*
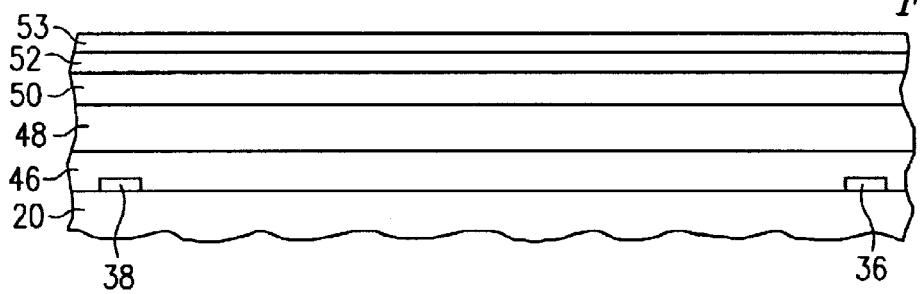
*FIG. 13B*
*FIG. 13C*
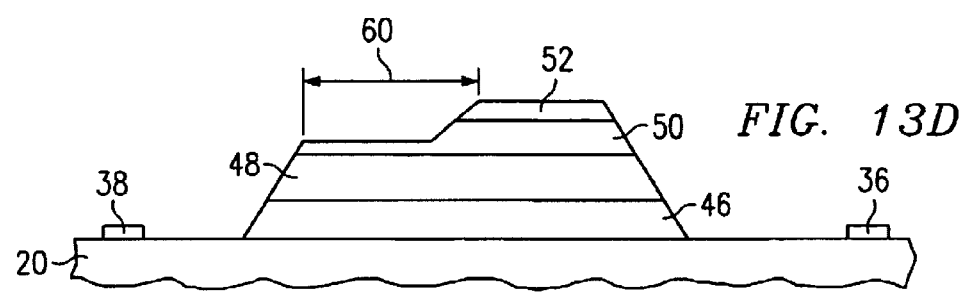
*FIG. 13D*

MULTISPECTRAL MONOLITHIC INFRARED FOCAL PLANE ARRAY DETECTORS

RELATED APPLICATION

The present application is related to and fully incorporates by reference to Application Ser. No. 09/833,363 filed Apr. 12, 2001, Entitled "MONOLITHIC INFRARED FOCAL PLANE ARRAY DETECTORS".

FIELD OF THE INVENTION

The present invention relates to multi-color infrared sensing devices. More specifically, the invention relates to monolithic multi-color infrared imaging arrays based on the direct growth of infrared sensitive mercury cadmium telluride material structure on custom-fabricated read-out electronics on specially oriented silicon substrates by Molecular Beam Epitaxy (MBE).

BACKGROUND OF THE INVENTION

Semiconductors are either naturally occurring or artificially synthesized materials in which the atomic arrangement gives rise to a specific atomic potential that forbids electrical carries (electrons or positive charges, known as holes) to freely move and therefore carry electrical currents. They act as insulators for as long as there is no additional energy provided to excite these carriers across the forbidden gap (called a band gap) that is generated by the atomic potential. An electrical current can be obtained by the excitation of electrons across the forbidden band. Necessary energy can be generated in different ways and of interest for radiation detection is the energy carried by the electromagnetic radiation waves. The incoming radiation has to be tuned (i.e. the radiation has to carry enough energy to be able to excite the electrons) with the band gap of the semiconductor in order to produce this excitation.

In a crystal, both short- and long-range order are important in defining single crystal structure. The atoms hold positions that can be associated with a well-defined grid (or lattice) having very small or nonexistent deviations from the grid positions through out the entire crystal. This periodicity in the atomic arrangement is of utmost importance for the electrical behavior of the crystal. A polycrystalline material has a short-range order, a specific geometrical positioning of the atoms in a lattice, but lacks long-range order. Only by performing a combination of translations and rotations can one recover the same geometrical arrangement of an initial test region. The polycrystalline material is formed by a multitude of grains consisting of individual single crystals. A long-range order means that by translating the crystal in any direction one recovers exactly the same structural arrangement of the atoms. A unit cell can be therefore defined, and the entire crystal can be regained by translations of this unit cell. An amorphous material lacks both short and long-range order, and consequently lacks any periodicity in its atomic arrangement.

FIG. 1 shows the unit cell for a cubic crystalline lattice and several crystal directions. The crystal planes are planes that contain atoms and are perpendicular to the respective direction. Shown as shaded, is the plane (100). Obviously, in the case of a cubic unit cell the chosen orientation of the reference system is arbitrary, thus the (100), (010) and (001) planes are equivalent. All the equivalent planes form a family of planes and are called by a generic name, which is one of the family member names. The atoms can occupy positions on the nodes of the grid or at intersections of principal lines within the unit cell (such as the center of lateral cubic faces or the intersection of body diagonals of the cube). The atoms can, as well, occupy positions at certain coordinates around the nodes or intersections of principal lines in what is called a basis. A cubic unit cell with atoms sitting at the nodal position as well as in the center of each cubic face is called a face centered cubic (fcc). Mercury cadmium telluride (HgCdTe or MCT) is an fcc lattice with a basis in which a secondary set of atoms is situated at ¼ of the cubic length away from the fcc atoms in the (111) direction.

Mercury cadmium telluride is a semiconductor widely used as an infrared detector material. It consists of elements positioned in group II (Hg, Cd) in the periodic table of elements and in group VI (Te). The crystalline MCT is formed as a ternary material from a HgTe (mercury telluride) crystal lattice in which a certain percentage of Hg atoms is being replaced by Cd atoms. By varying the amounts of Cd atoms in replacement of Hg atoms, the electrical properties of the entire crystal can be tailored to suit the absorption and subsequent conversion of the incident infrared radiation into electrical current. Thus, short wavelength infrared (SWIR) MCT has a Cd percentage that allows radiation absorption of short wavelengths. Similarly, mid-wavelength (MWIR) MCT has a Cd percentage that allows radiation absorption of medium wavelengths, and long wavelength (LWIR) MCT has a Cd percentage that allows radiation absorption of long wavelengths. The flexibility of matching the electrical behavior of the crystal to certain application requirements by adjusting the composition of the crystal is known as band gap engineering, and is one of the great advantages of MCT. Several techniques are available for producing MCT and by far, MBE is the most reliable.

Molecular beam epitaxy (MBE) is a chemical vapor deposition (CVD) method in which the crystal is grown on a template (substrate) from atomic and/or molecular fluxes obtained by thermal evaporation of the charge material. The growth process occurs in an ultra-high vacuum (UHV) environment to minimize the presence of foreign atoms. Polycrystalline and/or amorphous material are loaded into crucibles and constitute the charge. During the growth the substrate is kept at a predefined temperature to ensure that sufficient energy is transferred to the surface to achieve specific reactions. The fluxes are adjusted by the temperatures at which the charge materials are kept. In this way the incoming atoms/molecules from the charges have to spend a certain residence time on the surface while traveling/diffusing around in order to find a geometrical position that minimizes the surface energy.

In order to control and to enhance the electrical properties of the materials grown by MBE one can use this method to add certain impurities (dopants) to the primary material. This added control offers a large advantage since it reduces the post growth processing along with the costs and increases the yield factor.

The substrate is of paramount importance for the MBE growth of crystalline materials. Its choice is primarily dictated by the lattice parameters that have to closely match the ones of the intended new material. Exceptions are rare and mismatches create an unwanted density of defects/dislocations.

In order to act as a template, the substrate itself should be a single crystal and one has to expose the periodic arrangement of the bulk material. Typically, the bonds between atoms are saturated (i.e. an atom/ion uses all of its available electrons for bond formation with its neighboring atoms). At the surface, the lack of periodicity in the direction perpendicular to the plane forces the atoms lying on the surface to react (use their available electrons) and bond with other elements, different than those present in the bulk of the material. These elements that are present at the surface are called contaminants. Such a surface is useless for the MBE growth of single crystalline materials.

For the growth of MCT one can use as substrate bulk cadmium zinc telluride (CdZnTe) for which lattice matching occurs at a Zn percentage close to 4%. A constant demand of larger area detectors prevents the use of CdZnTe as substrates since they are available in limited sizes only. Bulk CdZnTe is also expensive and brittle, reducing further its use in production environments. When using CdZnTe as a substrate one is limited by the current device fabrication technology.

The crystals used as substrates (Silicon, CdZnTe and others) are fabricated by cooling a melt of material (pure elements or compounds) in a way that allows crystal formation. Once crystallized, the previously formed ingot is cut into wafers with various orientations. Since the wafer is a single crystal (hence it contains a large number of unit cells, to be viewed as "bricks") its surface can have various morphologies. The surface orientation of the substrate is very important since the initial nucleation process takes place on it. At this interface between the new crystal and the substrate the defects can be easily generated and they will further propagate through the entire crystal.

A major problem when growing a new crystal is twin formation. Crystal seeds that nucleate at different moments in time and at different locations are uncorrelated. For various surface orientations this correlation/uncorrelation can be beneficial (increasing the probability that only one crystalline orientation will survive throughout the growth process, generating a single crystal) or detrimental (supporting equally various orientations and ending with a polycrystalline material).

A silicon surface that has orientation (001) is almost flat (FIG. 3). Theoretically, it should be flat since integers of unit cells can be fit within the crystal. Other reasons are called upon to explain the surface morphology in this case. The surface energy is minimized by forming terraces. The terrace steps are almost +/−1 monolayer from what is called the substrate surface. All the orientations that do not fit an integer number of the unit cell at the surface are bound to form steps, their number increasing with the wafer area. FIG. 2 shows a schematic of a (211) surface.

Mercury cadmium telluride is by far the most sensitive and commonly used material for infrared detectors. Such detectors generate a signal whose magnitude is proportional to the intensity of the incident radiation.

Every object usually has a distribution of 'hot' and 'cold' regions in it. The image generated by an array of photon detectors consists of white and black contrast corresponding to the hot and cold regions of the object or scene. An infrared imaging device consists of a plurality of photovoltaic diodes (detectors) fabricated on an infrared sensitive material (such as HgCdTe). When used for imaging, the signal generated by each diode has to be collected separately and multiplexed to re-construct an image on the video screen. The photovoltaic detector essentially consists of a junction formed by two dissimilar (p-type and n-type) conductivity regions in the infrared sensitive material as shown in FIG. 4A. The incident infrared radiation creates electron and hole pairs that are collected by the potential difference at the p-n junction leading to the 'signal'. Also shown in the figure is the energy band diagram corresponding to the p-n junction formed in a heterostructure. The heterostructure means that the band gaps of the two regions (p and n) are different. The narrow band gap side of the junction is the absorber layer whose band gap is tuned to detect the particular wavelength of interest. The band gap of the top layer (p-layer in the FIG. 4B) is more than that of the n-layer. Such p-n junctions formed in a heterostructure reduce the surface-passivation related leakage currents.

Conventionally, the multiplexing electronics used for infrared detectors is fabricated separately on a silicon substrate. Indium metal bumps are then formed on each diode and the plurality of devices on the two different materials is then connected together by a 'hybridization' process. These devices operate usually at 77K, the liquid nitrogen temperature, because of effects of thermal excitation. This thermal excitation process becomes concurrent to the radiationinduced excitations. In order to reduce it and to reduce its effects (dark current, noise) the detector operates at low temperature. When cooled to this temperature, the two different materials that together form the infrared imaging device (HgCdTe diode array and the read-out circuit) expand at different rates. The different coefficients of expansion lead to failure of the indium bump interconnection between the infrared detector and the signal processor, resulting in poor image resolution.

The increased demands on performance of silicon semiconductor devices and microcircuits have required the development of improved processing techniques. A key advance in the modern solid-state technology is clean processing in order to prevent the contamination of sensitive surfaces so that the stability and reproducibility of device characteristics are improved.

Traditionally, the Si wafers were cleaned using wet chemical etching processes, such as the RCA process (W. Kern and D.A. Puotinen, Cleaning solution based on hydrogen peroxide for use in silicon semiconductor technology, RCA Rev. 31, 187 (1970)) and the Shiraki processes (Japanese Laid-Open Publication No. Sho 63-46765) and a thermal cleaning in vacuum. For the Si wafers to be ready for epitaxial growth they have to undergo a contaminant removal step as well as a surface passivation step. The contaminant removal step assures that the Si surface is clean and free of foreign elements (contaminants).

Surface contaminants can be classified as molecular, ionic and atomic. Molecular contaminants are typically carbohydroxides and carbohydrides originating in the mechanical operations performed during the fabrication and handling of wafers. Organic solvent residues, grease or greasy films from containers are such molecular impurities held usually by weak electrostatic forces. Ionic contaminants are typically present after chemical etching, and can be physisorbed or chemisorbed onto the surface. Alkali ions are particularly harmful for epitaxial growth since they are known to give rise to different crystal defects. Atomic contaminants include metals such as gold, silver and copper. Atomic impurities, especially the heavy ions, have a detrimental effect on the overall performance of the devices.

Once the contaminants are removed from the wafers, the bare Si atoms of the surface are highly reactive. Atoms lying on the surface have electrons that do not participate in the bonding with the bulk atoms, creating so-called dangling bonds (FIG. 7 and FIG. 8). These dangling bonds represent unsaturated conditions with a high potential energy. They tend to grab and form bonds with any available atoms and therefore re-contaminate the surface.

In order to prevent the contamination of these surfaces during further processing and/or handling (like the loading into the MBE chamber) a passivation step is necessary. The passivation step consists of a controlled deposition of a thin layer of oxide that can be removed by thermal heating inside the MBE chamber before the growth of II–VI layers commences, to rereveal the dangling bonds of the surface Si atoms. More particularly, the oxide layer is thermally desorbed at temperatures above 850° C. in an MBE growth chamber, thereby exposing a clean Si surface suitable for epitaxial growth. Importantly, the conventional approach requires thermal treatment of the Si wafer at a temperature above 850° C. to remove the passivation layer. It is to be noted that this passivation step is for the initial growth surface (of the ROIC) that needs to be distinguished from the device passivation with CdTe as described later.

Moreover, crystal quality of HgCdTe grown on conventional CdZnTe bulk substrates or CdTe thin films is detrimentally impacted by the substrate's surface quality. More particularly, the cleaning process results in an uneven surface due to the different etching (reaction) times of the various constituents (such as Cd vs. Te, or Cd vs. Zn). The HgCdTe crystal quality is affected by the defects that are formed at the interface during the nucleation. Moreover the contamination that is created by exposing the substrates to the environment is not entirely removed by the cleaning process. The presence of foreign atoms on the substrate creates nucleation centers for defects within the HgCdTe layers.

Read-Out Circuits (ROIC) are prone to failure at high temperatures. Consequently, applications requiring an optoelectronic device to be grown on an ROIC require that the entire process, be carried out at temperatures below the maximum sustainable temperature of ROIC. By subjecting some test ROICs to various temperatures in an MBE system and measuring the ROIC performance before and after the temperature treatments, we determined that the maximum temperature for the integrity of the components and circuits in the ROIC is about 500° C. Consequently, conventional methods for preparing Si wafers are not acceptable because they require a thermal treatment at or above 850° C.

SUMMARY OF THE INVENTION

A monolithic multispectral infrared detector array is provided for advanced imaging systems with capabilities to discriminate actual targets against decoys. The multispectral infrared detector simultaneously detects infrared radiation emitted by the target in more than one wavelength range. The unit cell of the integrated detector consists of two co-located detectors, each sensitive to a different infrared wavelength.

An infrared sensing device is provided which includes a plurality of infrared detectors containing planar photovoltaic diodes fabricated on a mesa-shaped II–VI semiconductor multi-layer structure produced by molecular beam epitaxy technique on a readout integrated circuit, which is pre-fabricated on a special silicon substrate. Two different designs for the monolithic multi-color infrared detector, (1) side-by-side architecture where the two rows of infrared detectors corresponding to two different response wavelengths are located side-by-side, and (2) simultaneous architecture, where the two detectors corresponding to two different response wavelengths are stacked together vertically, fabricated on the II–VI material structure grown on pre-fabricated ROIC, are provided in this invention. The infrared detectors are planar (p-HgCdTe regions are formed by arsenic implantation) in the first design and mesa (all HgCdTe layers are doped in-situ during the growth of HgCdTe layers by MBE) in the second design.

According to one aspect of the invention, the readout circuit (ROIC) that is needed for processing the signal generated by an infrared device is custom designed and fabricated in a standard semiconductor foundry. In the prior art such ROICs are fabricated on (100) oriented silicon wafer in such a way that the ROIC could be joined to the infrared device containing plurality of detectors by indium columns formed on each detector. This process of joining the infrared device and ROIC device is called hybridization. The yield in such prior art devices is poor due to the difference in the thermal expansion coefficients of the ROIC and infrared device at the operating temperature of 77K and the high-risk hybridization process itself. In this aspect of the invention, to enable defect-free II–VI semiconductors on silicon, the authors found that the ROIC needs to be fabricated on silicon substrates with one degree or the like tilted from the (100) crystal direction. This ensures twin-free growth of II–VI HgCdTe layers. Secondly, to preserve the circuits in the ROIC, a window free of any underlying circuits is provided for the subsequent growth of II–VI layers. To fabricate a plurality of infrared detectors connected to the ROIC, the signal input gates of ROIC covered with aluminum metal are provided in two rows adjacent to the growth window.

According to another aspect of the invention, a procedure to prepare the ROIC surface at or below 500° C. is provided. The authors have found that this is the maximum temperature to which the ROIC could be subjected during the II–VI material growth. In the prior art, to grow II–VI material by MBE, the substrates need to be cleaned at or above 850° C.

According to another aspect of this invention, the authors present the procedure to grow a multi-layer HgCdTe structure on the ROIC prepared according to the previous aspect of the invention. Due to the 19.3% lattice mismatch between the silicon and II–VI materials, it was previously thought that II–VI layers couldn't be grown on silicon. By employing the low temperature surface preparation and growing a CdTe buffer layer, the authors have achieved single crystalline growth (the crystallinity is confirmed by the streaky pattern observed during the MBE growth) of at least one HgCdTe layer on the ROIC pre-fabricated on one-degree tilted (100) silicon substrates.

According to another aspect of the invention, the authors fabricate an infrared detector array containing two photovoltaic infrared detectors in each cell of the array formed on a mesarial like material structure that includes at least three layers of Group II–VI semiconductor material having different band gaps. Each infrared detecting cell is electronically connected to the corresponding signal input cells in the ROIC. The wider band gap layer significantly reduces the surface passivation-related leakage currents in the infrared detector.

According to yet another aspect of the invention, the signal output from each detector is conductively connected to the signal input cell of ROIC. Since the detector output and the ROIC input cells are located in two different planes with at least 15 micrometers height difference, the authors fabricate a mesa structure at the edges of the growth window. This is constructed by a special etching in bromine-methanol solution. Each detector output cell is then connected to the plurality of ROIC signal input gates by individual metal electrodes running down the low angle slope side of the mesa despite the large height difference between these two planes. Also, the detector common cell is connected to the ROIC common cell in a similar way.

DESCRIPTION OF THE DRAWINGS

Reference is made to the following drawings, in which like characters denote like parts, and in which:

FIG. 12 is a cross-sectional view of the readout integrated circuit of FIG. 11 with a mesa group of detectors formed thereon;

FIGS. 13(A) to 13(I) are the cross sectional views of the process steps for producing the monolithic infrared device of FIG. 12;

DETAILED DESCRIPTION OF THE INVENTION

A technology for producing a plurality of infrared sensing elements in a monolithic array format is provided. Each element has a multi-layer structure of mercury cadmium telluride (HgCdTe), a group II–VI semiconductor. The infrared sensing devices of the present invention are monolithically connected to a readout electronic circuit (ROIC). In other words, both the infared sensing elements and the read-out electronics are fabricated on a common silicon substrate. The monolithic connection of the present invention eliminates the need for conventional columnar indium metal electrodes and the low-yield hybridization process by the direct growth of the complex HgCdTe structure on pre-fabricated read-out electronics on a silicon substrate by Molecular Beam Epitaxy (MBE).

The present inventors have discovered that Silicon (Si) covered by a thin buffer layer film of, for example, CdTe (cadmium telluride) is a viable alternative substrate to bulk CdZnTe. Specifically, they have invented that a readout circuit (ROIC) pre-fabricated on silicon can be used as substrate for CdTe buffer and subsequently HgCdTe detector layers growth by MBE resulting in 'monolithic infrared detectors'.

The current invention couples monolithically the high performance of silicon signal processing circuits (Si-ROIC) with HgCdTe-based infrared devices. The enormous lattice mismatch between the silicon and HgCdTe layers is overcome by the growth of a CdTe buffer layer directly on the Silicon ROIC by MBE.

Figure 1:
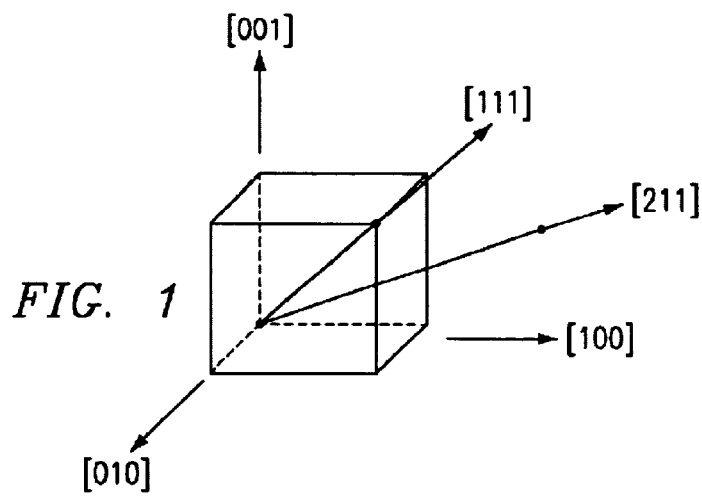
FIG. 1 shows the unit cell for a cubic lattice and several crystal directions.
Figure 2:
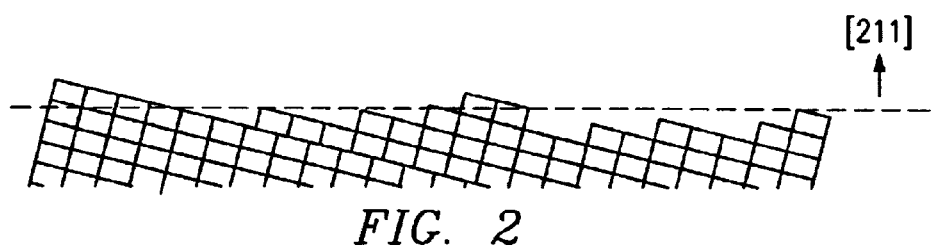
FIG. 2 is a schematic diagram of silicon (211) surface.
Figure 3:
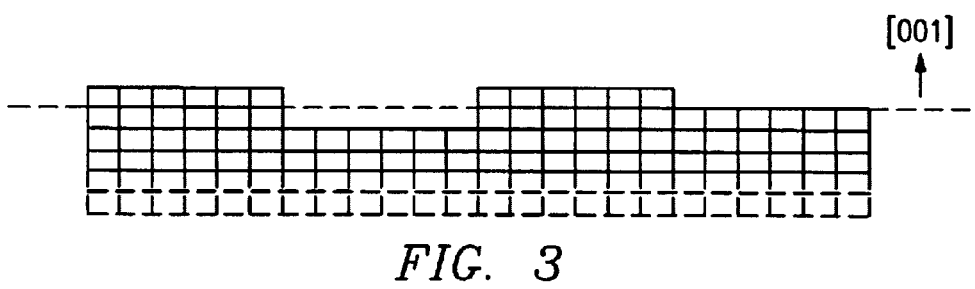
FIG. 3 is a schematic diagram of silicon (001) surface.
Figure 4A:
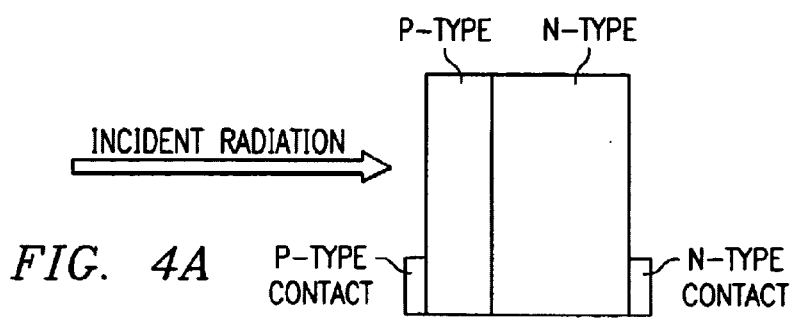
FIG. 4A is a physical diagram of a p-n junction.
Figure 4B:
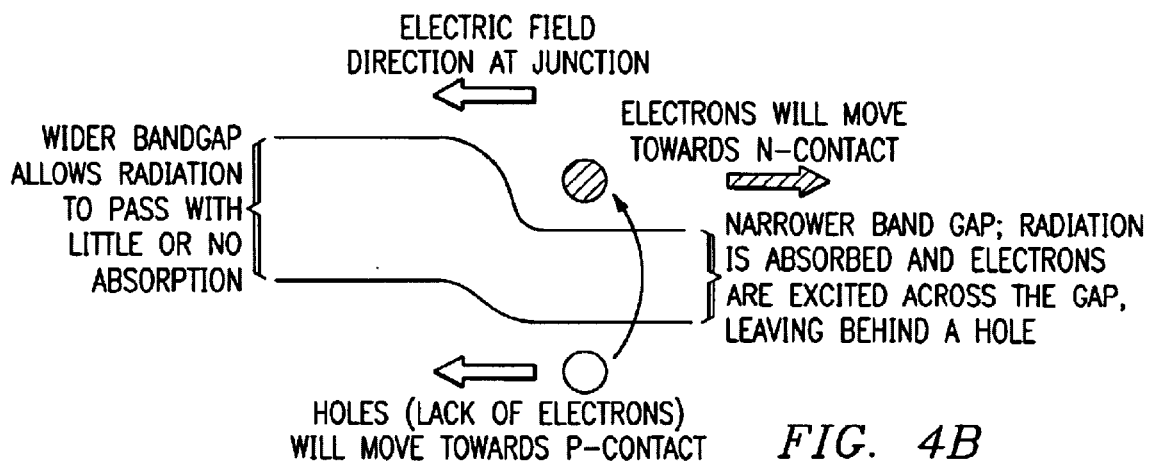
FIG. 4B is an energy diagram of the p-n junction of FIG. 4A.
Figure 5:
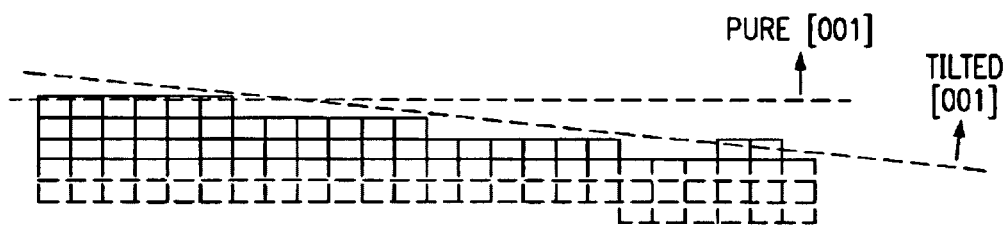
FIG. 5 shows a tilted (001) silicon surface.

The growth of CdTe(111)B (where B represents the polarity of the molecular arrangement, i.e., Te terminated surfaces) can be performed successfully on Si(001) tilted around 1° off axis. The tilt of the surface orientation enhances the correlation between seeds and suppresses twin crystal formation, leading to a single crystal film. A schematic diagram of such a surface is shown in FIG. 5. For a tilted (001) surface the morphology shows terraces and additional steps spaced out to accommodate the surface tilt. The tilted surface induces a larger number of steps on the surface, and these steps are beneficial for the growth of twin-free single crystal material.

Figure 18:
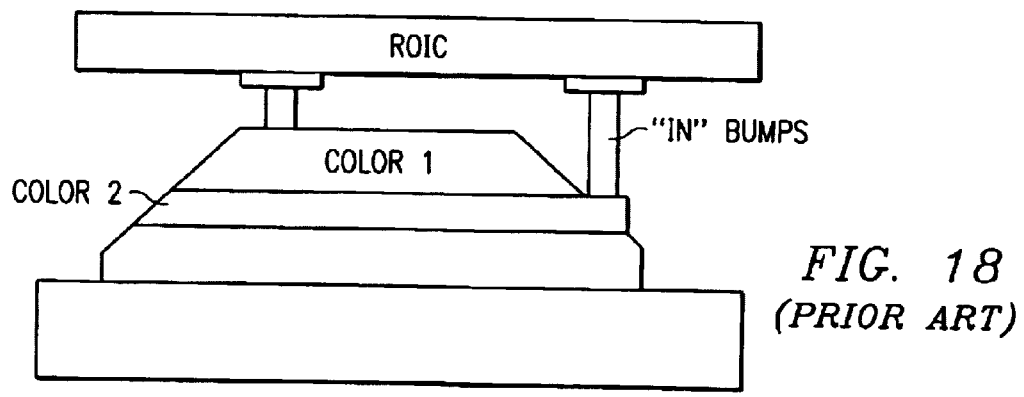
FIG. 18 is a schematic of a conventional hybrid focal plane infra-red detector array (prior art).

The Si substrate, which is rather inexpensive, offers a rugged, stable mechanical support for the entire structure. Moreover, the Si substrate can carry an additional microelectronic device enabling further integration with the devices to be fabricated onto MCT. More particularly, according to the present invention MCT detectors are monolithically integrated with Si Read-Out Integrated Circuits (ROIC), providing substantial benefits over conventional techniques in which ROIC are hybridized onto MCT detectors using Indium bumps (see, e.g., FIG. 18).

Similar results may also be achieved by combinations of buffer layers other than CdTe or CdZnTe and other II–VI semiconductor layers for infrared absorption. The p-n junctions in a device formed according to the present invention are planar and are totally buried under a wide band gap HgCdTe layer achieving very high dynamic impedance and sensitivity.

An aspect of the present invention relates to a procedure to clean ROIC-Si(001) in preparation for epitaxial growth of semiconductor films by MBE. The semiconductor films are grown on a vicinal or off-angle silicon wafer, at a temperature below the maximum sustainable ROIC temperature of 500° C.

Commercially available Si-ROICs are suitable for hybridization only (current state-of-the-art). A modified ROIC according to the present invention includes a circuit fabricated on a silicon wafer having a tilted orientation and having a window uncovered by previously fabricated circuits, that will be used for direct growth of detector material is described herein. Growth of II–VI semiconductor material on Silicon wafers with built-in ROICs can be performed on various Si orientations, like (211), (111), nominal surfaces or off-axis.

Si(001) wafers have been considered the most widely used semiconductor material for fabrication of various advanced electronic devices and as substrates for the growth of many homoepitaxial or heteroepitaxial layers, such as Si/Si, SiGe/Si, GaAs/Si, ZnSe/Si and CdTe/Si. For all these epitaxial structures, a clean Si substrate has to be prepared prior to the onset of the epitaxial growth. A large number of contaminants present on the Si surface can prevent the growth of single crystalline material, while a reduced number of contaminants results in the growth of an epilayer with a commensurate level of defects. Ideally, all contaminants are removed in order to obtain reliable and reproducible results.

Prior to applying the methods described in the current innovation, the surface of the Si(001) wafer must be cleaned and passivated. More particularly, the wafer may be cleaned using a conventional wet chemical method or the like in order to obtain an atomically clean surface.

Alternatively, the wafer may be cleaned using an oven containing a source of ozone, such as a Mercury lamp. The ozone generated in the oven will react with the wafer contaminants and reaction products will be removed. However, the use of low temperature cleaning processes is preferred because the components in the ROIC degrade if subjected to temperatures >500° C.

To prevent recontamination, it is necessary to cover the freshly cleaned surface with a thin oxide to passivate any dangling bonds on the cleaned surface. Moreover, this oxide layer needs to be removed in-situ in the MBE chamber before the CdTe buffer layer growth starts.

A first aspect of the present invention relates to a two-step etching process for removing the oxide layer selectively from the growth window on the ROIC. First, the wafer is wet etched in a diluted solution of $HF:H_2O$ (2–10%) for 50 to 80 seconds. The water used in the wet etch solution should be deionized water with above 18 megaohms resistivity. The first etching step must be sufficient to effectively remove the oxide layer previously formed.

Figure 6:
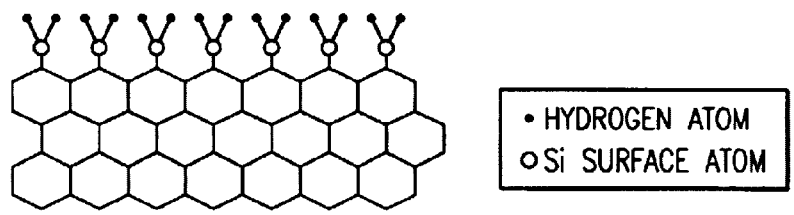
FIG. 6 shows a Si (001) surface prepared according to one aspect of the present invention.

After the first etching in HF solution, the wafer is slowly pulled out of the solution and immediately submerged into concentrated $NH_4F$ (20%–40%). The period of time during which the ammonium fluoride etch is performed is critical. This second wet etch will yield a dyhdride terminated, smooth Si(001) surface for etching periods of 30 +/−10 seconds. The dyhdride terminations provide a passivation layer as shown in FIG. 6.

Figure 7:
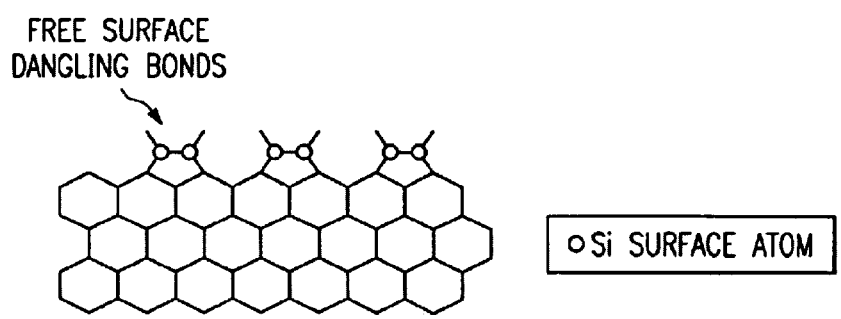
FIG. 7 shows the Si (001) surface of FIG. 6 after being heated at temperatures between 375°–500° C.
Figure 8:
FIG. 8 shows the surface of Si (001) of FIG. 7 that has been over-etched in NH4F revealing (111) facets covered by monohydrides.

A short exposure leaves portions of uncovered silicon surface as shown in FIG. 7, sensitive to future contamination, and some portions of silicon with passivation consisting mostly of mono- and trihydrides. A long etching time in $NH_4F$ produces rough surfaces with (111) facets covered by monohydrides as in FIG. 8.

Figure 9A:
FIG. 9 describes the prior art process as applied to growing MCT (FIGS. 9A and 9B) versus the newly proposed process (FIG. 9C)
Figure 9B:

According to current growth techniques, in order to grow HgCdTe on Si, two separate MBE systems are used, one that will allow the growth of CdTe thin films that will become a substrate for growth in the second chamber. This process is illustrated in FIGS. 9A and 9B. Referring to FIG. 9A, a CdTe layer 1 is grown on a silicon substrate 2. The newly formed substrate 3 is suited for growth after undergoing a typical substrate cleaning procedure. An HgCdTe (FIG. 9B) layer 4 is then grown in the second system.

Figure 9C:
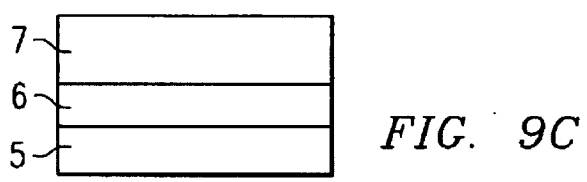
Figure 10A:
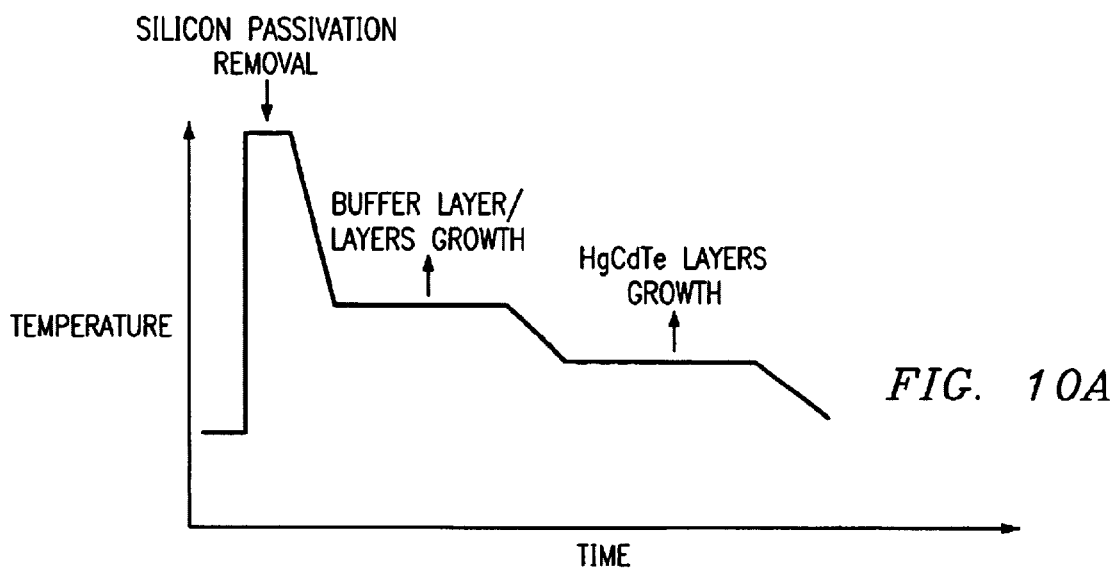
FIGS. 10A and 10B are schematics of the temperature profile during the growth of CdTe and HgCdTe using a single MBE chamber.
Figure 10B:
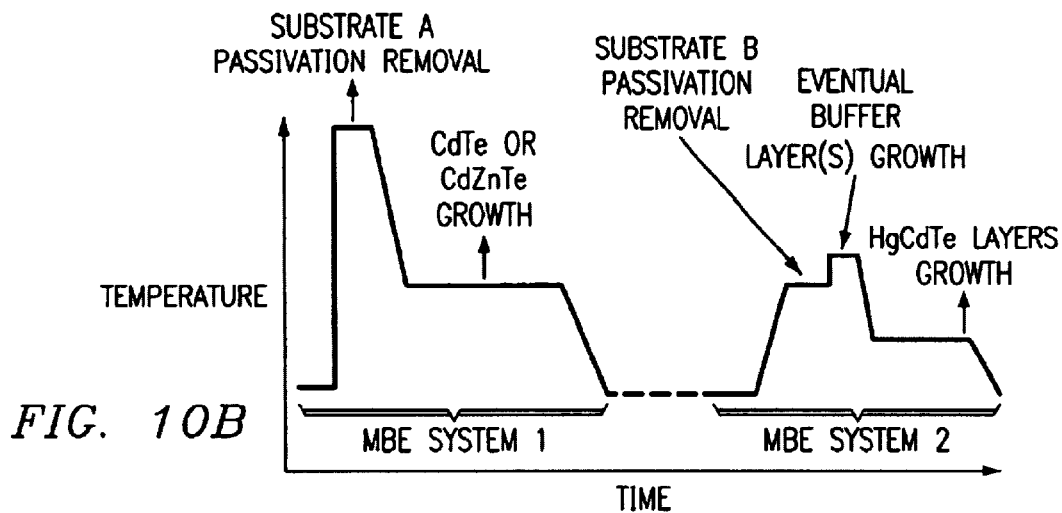

One aspect of our invention offers the alternative to use one chamber only, capable of carrying the necessary charge sources. The growth will then involve a buffer layer 6 (FIG. 9C) grown on a silicon substrate 5, followed by the growth of an HgCdTe layer 7 (FIG. 9C). The growth schematics for the two processes are shown in FIGS. 10A and 10B. FIG. 10A shows the substrate temperature profile for the growth using one MBE system. FIG. 10B shows a substrate temperature profile using two separate systems.

To produce a monolithic infrared device, two embodiments consisting of two different design formats are presented in this invention. The first design involves two-color infrared detectors fabricated in two rows side-by-side with one color detectors connected to a top row of ROIC input gates, while the other color connected to another, bottom row of ROIC input gates. The infrared detectors are planar here, with p-HgCdTe regions formed by arsenic implantation. The second design stacks the two-color infrared detectors one on the other for simultaneous mode detection. The infrared detectors here are fabricated in mesa format with the HgCdTe layers doped in-situ during the MBE growth, directly on the Si-ROIC.

Figure 11:
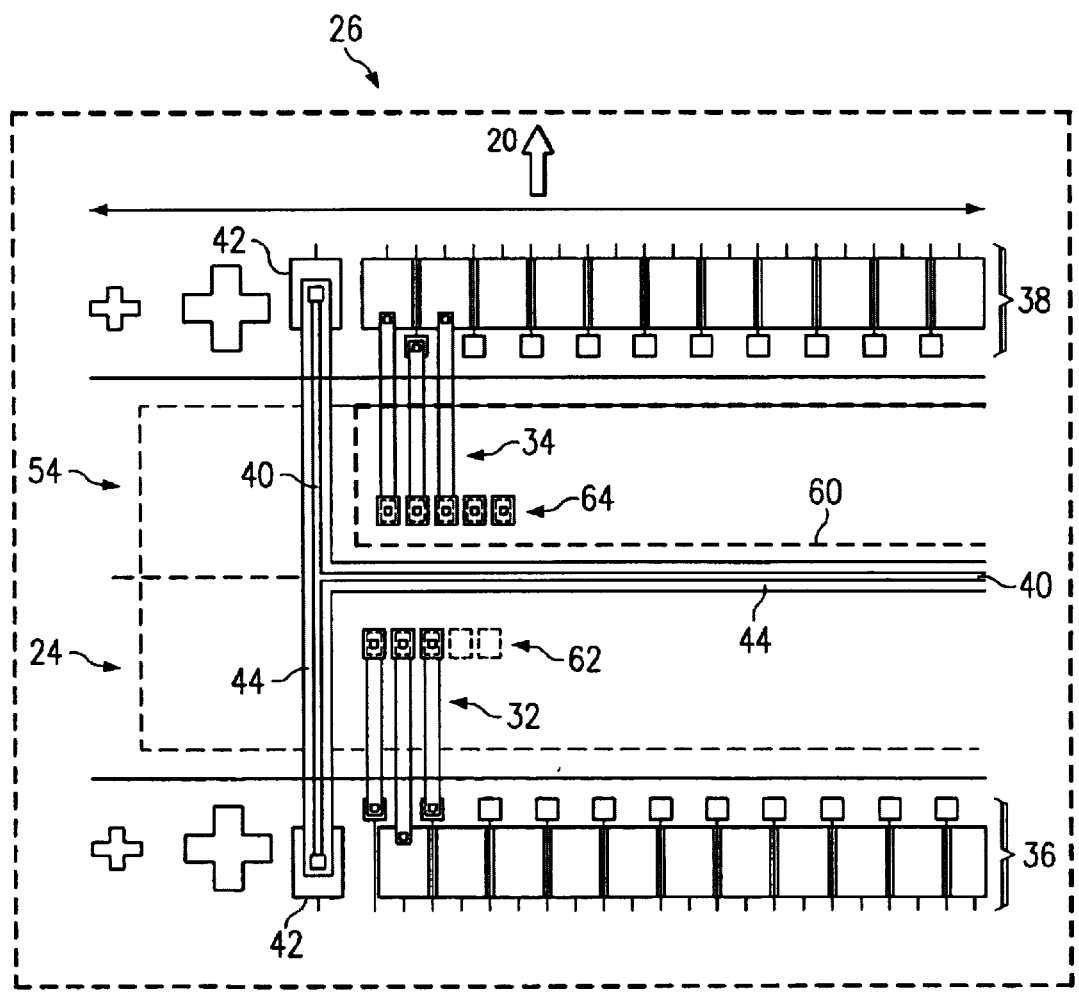
FIG. 11 is a top view showing the infrared devices monolithically connected to the input gates of a readout circuit in a side-by-side architecture according to one of the embodiments of the present invention.
Figure 15:
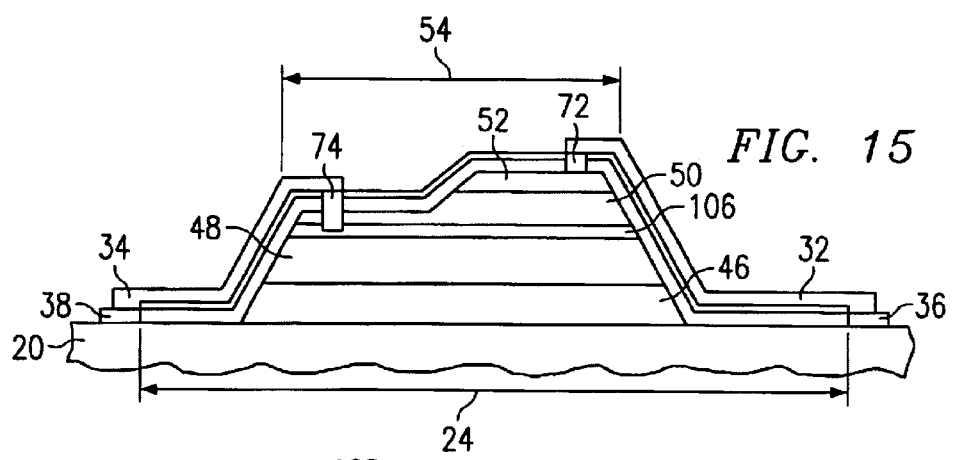
FIG. 15 is a cross-sectional view of the monolithic infrared device shown in FIG. 14.

FIG. 11 is a top view of an ROIC 20 used to process signals generated by the detectors of the present invention. The entire ROIC 20 is covered with silicon nitride or silicon dioxide encapsulant (the partially etched portion of this layer 22 is shown in FIG. 13A). A window 24 is etched in the custom designed ROIC 20 in a region that is free of any underlying circuits (see FIGS. 11 and 12). A part of the ROIC relevant for the growth of HgCdTe material and subsequent device fabrication is shown here. On either side (top and bottom) of FIG. 11, the rest of the readout circuits including the shift registers for the signal processing are distributed (not shown here). Also these figures show only a few of the detectors of the total 256 detectors in one row connected to the ROIC. The corresponding cross sectional views of one of the detector elements are shown in FIGS. 12 and 15 respectively for the two design formats.

FIG. 12 is a cross-section of one element 26 (of FIG. 11) of the multispectral (capable of detecting two different infrared wavelengths) infrared detector array device 26 according to the present invention. The details of the rest of the detector elements in the linear array of detectors are the same. The entire device 26 includes a silicon substrate 28 on which a readout circuit (ROIC) 20, and multiple layers of Group II–VI semiconductor materials grown on ROIC 20, on which a large mesa 54 and another mesa 61, on the mesa 54, are formed. At least two infrared detecting cells aimed to detect two different infrared wavelengths are formed in each mesa 54 and 61 and the two detector outputs are connected by electrically conducting interconnect layers 32 and 34 to the respective input gates 36 and 38 of ROIC 20 as shown in FIGS. 11 and 12. Similarly, the common contact 40 for the entire detector array is connected to the common contact 42 of the ROIC 20 by conducting interconnect layer 44 (see FIG. 11).

A step-by-step process for the fabrication of the multi-color monolithic infrared detector array according to the first design is shown in FIG. 13. The window 24 is chemically etched in the silicon nitride layer 22 by performing a conventional photolithography process (FIG. 13A), which is well known in the art.

More particularly, after the removal of the passivation (FIG. 13A) from the growth window 24, the substrate is cooled under Arsenic flux from 500° C. to 400° C., followed by a cooling under CdTe flux from 400° C. to 350° C. Next, the substrate is cooled down to 210° C. and CdTe is deposited at this temperature for about 2 minutes. The substrate is then heated to about 310° C. under Te flux and from 320° C. to 350° C. under Te and CdTe fluxes. The substrate is kept at 350° C. for 10 minutes under CdTe and Te fluxes. Next, the substrate is cooled to about 310° C. under Te flux. At this temperature an additional 4–8 micrometers of CdTe are grown with CdTe flux that assures a growth rate of about 0.2 nm/second.

After this process, the sample is cooled to the HgCdTe nucleation temperature of about 180° C. and allowed to stabilize for about an hour under no material flux. The HgCdTe growth process is then initiated. First, the grown CdTe surface is exposed to the Hg flux. The flux is adjusted such that the chamber pressure is around $2.0 \times 10^{-5}$ Torr. Next, a Te flux is provided for about 10 seconds followed by a subsequent exposure to CdTe. The Te and CdTe fluxes are adjusted so that their ratio provides the growth of HgCdTe with desired composition.

During the growth the surface is always exposed to Hg, Te and CdTe fluxes. The substrate temperature is ramped down during the growth of HgCdTe to compensate for the heat absorption into HgCdTe layer, as it grows. The HgCdTe growth process takes approximately 4 hours, and the entire growth time, from loading to unloading, takes about 20 hours. The result is shown in FIG. 13B. In FIG. 13B once the buffer layer 46 is grown, the growth of HgCdTe commences.

It should be noted that, depending on the buffer material used, a waiting period may be necessary prior to MCT growth. The waiting period being defined by the difference between the growth temperature of the buffer and the growth temperature of the HgCdTe layer, and by the system ability to adjust to the new temperature setting.

During the waiting period the buffer layer may be exposed to specific fluxes (like Tellurium, Mercury, others) in order to prevent any material or specific atomic species from desorbing.

A buffer layer 46 of CdTe or the like is first grown, followed by the growth of indium doped n-type HgCdTe layer 48 suitable for detecting a first wavelength of infrared radiation and another indium doped n-type HgCdTe layer 50 suitable for detecting a second wavelength of infrared radiation (FIG. 13B). Both these layers are n-type because the p-regions will be selectively formed in these layers at a later stage in the process.

A wider band gap HgCdTe layer 52 is then grown. The band gap of this layer is more than that of the previous layer 50 and the p-n junction will be later formed in layer 50 through layer 52. Due to the wider band gap, the surface passivation-related leakage currents will be significantly reduced compared to the situation where layer 52 is absent and the layer 50 is passivated. A thin CdTe layer 53 is then grown by MBE.

A mesa structure 30 is then selectively etched by performing photolithography, where the material under window 54 is protected using 5 micron thick photoresist, the cross section of which is shown in FIG. 13C. In the other dimension, the length of this mesa is approximately the length of the ROIC 20. A bromine-hydrobromic (HBr) acid solution is used to perform the etch. Preferably, the acid solution is 4% bromine in HBr acid.

Due to the fast etching characteristics of this solution, considerable undercutting is achieved in the side walls 56 (FIG. 13C) of the mesa leading to a low angle slope 58 (FIG. 13C). Due to the residence time of the etching chemical, the top layers undergo more lateral etching compared to the bottom layers leading to the mesa shape shown in FIG. 13C. The angle 58 of the slope 56 with respect to the horizontal plane is about 45 degrees. As will be explained below, the low slope angle is important in forming a monolithic interconnect layer. Preferably, a slope angle of between 40 to 50 degrees with respect to the horizontal plane is required to achieve good step coverage of the metal running along the slope 56 for connecting the detector output to the ROIC signal input gates 36 and 38 and the detector common 40 to ROIC common 42.

A second mesa structure 60 within the first mesa 54 is then etched in a similar way as described in the previous step. The etching of this mesa makes the HgCdTe layer 50 belonging to the second infrared wavelength detection accessible. During etching of this mesa the top CdTe layer 53, the HgCdTe layer 52 and part of the HgCdTe layer 50 (about 80% of the thickness) are removed. The protecting layer of photoresist used in the lithography step is then removed with acetone. The entire surface is then cleaned by rinsing in dilute 0.05% bromine in methanol followed by cleaning in flowing deionized water for 2 minutes. The device at this stage is shown in FIG. 13D.

Figure 13E:
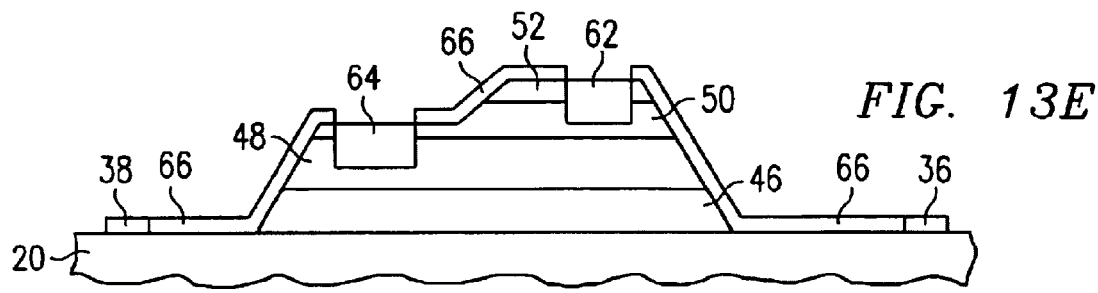

The p-n junctions 62 and 64 are then fabricated by performing another photolithography and selectively opening windows in the freshly coated photoresist 66 (of 5 µm thickness) for arsenic implantation as shown in FIG. 13E. Ion implantation is one of the standard techniques to change the polarity of the electrical conduction in selected regions in a semiconductor.

After opening windows in the 5 micrometer thick photoresist 66, arsenic ions are implanted with 350 keV energy and a dose of $1 \times 10^{14}$ cm$^{-2}$. Due to the high initial energy (350 keV), arsenic travels into the HgCdTe layers 48 and 50 typically a distance of less than a micrometer. However, the implanted arsenic is not yet electrically active. A post-implant annealing is performed to activate these arsenic atoms to change the conductivity in regions 62 and 64 to p-type.

The layered, selectively implanted ROIC 20 is then annealed in an ampoule containing mercury overpressure to activate the arsenic. The ampoule contains two compartments with a constriction in between. The sample is placed in the top compartment while a tiny droplet of mercury is placed in the bottom. Due to the high vapor pressure of mercury, the top compartment is under mercury overpressure. A tiny droplet of mercury provides enough overpressure to avoid any outdiffusion of mercury from the sample surface. The mercury over pressure is necessary to avoid the creation of vacancies in the multi-layer HgCdTe structure by outdiffusion of mercury atoms.

The annealing is done in three steps: 425° C., 10 minutes; 300° C., 12 hours; 235° C., 12 hours. This annealing gives rise to about $10^{17}$/cm$^{-3}$ carriers in the arsenic doped regions 62 and 64 and about $10^{15}$/cm$^{-3}$ in the indium doped n-type HgCdTe layers 48 and 50. Note that the p-n junctions 62 and 64 are formed in different HgCdTe layers 48 and 50 with band gaps corresponding to two different infrared radiations. The junction 62 is sensitive to one infrared color and the junction 64 is sensitive to another infrared color.

Figure 13F:
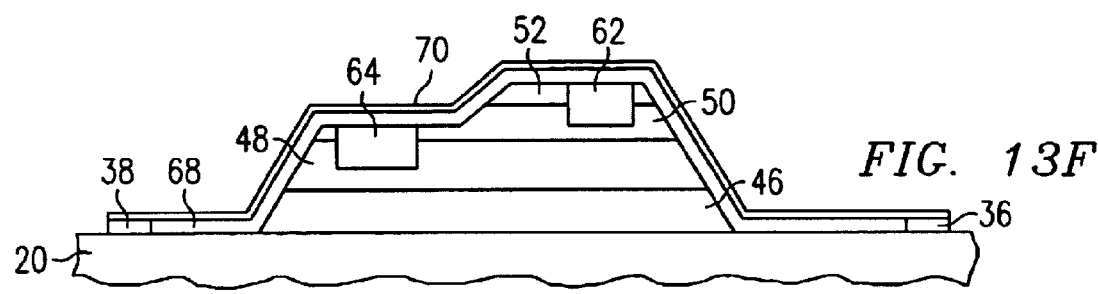

After the annealing, the entire surface is then cleaned by rinsing in dilute 0.05% bromine in methanol followed by cleaning in methanol and flowing deionized water for 2 minutes. A thin CdTe layer 68 (100 nm thickness) followed by a 200 nm thickness of ZnS 70 are deposited on the surface of the sample for passivating and protecting it. The cross sectional view of the device at this stage is shown in FIG. 13F. One of ordinary skill in the art will appreciate that standard methods like thermal or electron beam evaporation may be used in place of MBE to deposit these CdTe 68 and ZnS 70 layers.

Figure 13G:
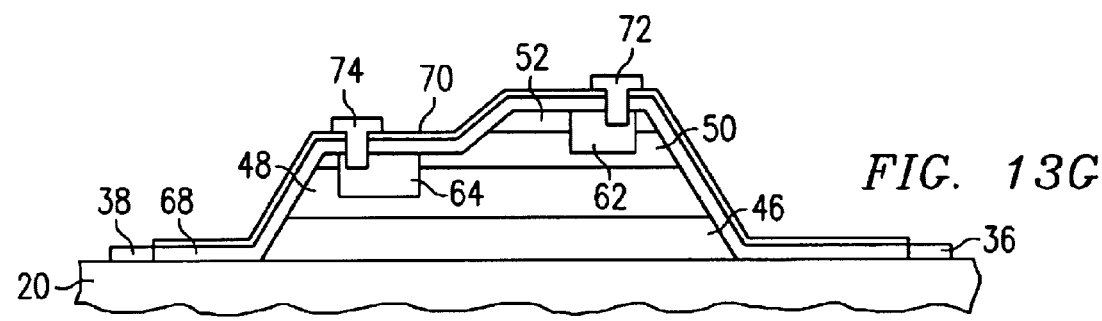

In the next step, the contact windows within the implanted areas 62 and 64 are opened by performing photolithography and a 100 nm thickness of gold metal deposited selectively in the windows by a conventional lift-off technique to create contacts 72 and 74 as shown in FIG. 13G.

Figure 13H:
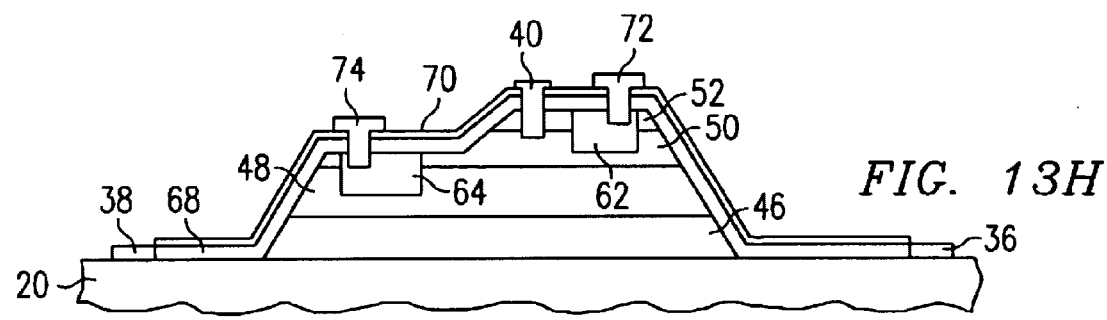

The detector common contact 40 is then formed by selectively opening a window through another photolithography step and depositing 50 to 100 nm of indium metal using a lift-off technique (FIG. 13H).

Figure 13I:
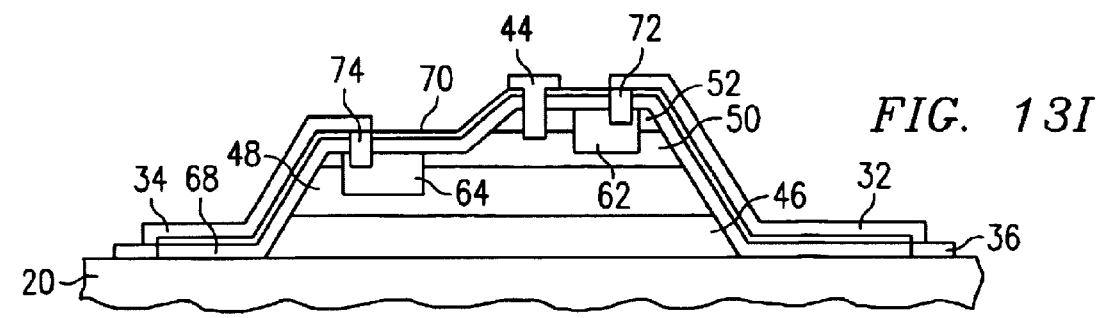

The contacts 72, 74 of detectors 62, 64 are then connected to the corresponding signal input gates 36 and 38 of the ROIC 20 by monolithic interconnects (FIG. 13I). Similarly the detector common contact 40 is connected to the ROIC 20 common contact 42 by the monolithic metal interconnect 44. The monolithic metal interconnect in general consists of a bi-metal layer of 30 nm thick titanium followed by 100 nm gold deposited in an evaporation system as is the standard in semiconductor device processing. More particularly, the monolithic interconnects 19, 20 and 44 are formed on the sloping sides 56 of the mesa 30 by depositing a bi-metal layer of titanium-gold by a photolithographic lift-off technique, thus connecting the detector output to the ROIC input gate despite the more than 15 $\mu$m height difference in the two planes.

An alternative embodiment 104 of the two-color detector array of the present invention will be described with reference to FIGS. 14–17, in which like reference numerals correspond to like structures/compositions. The major difference between this embodiment and the previous one is that to achieve the conductivity change to form p-n junctions, in-situ doping (both p and n types) is used instead of arsenic implantation. The advantages are a reduced number of process steps and more flexibility in design.

Figure 14:
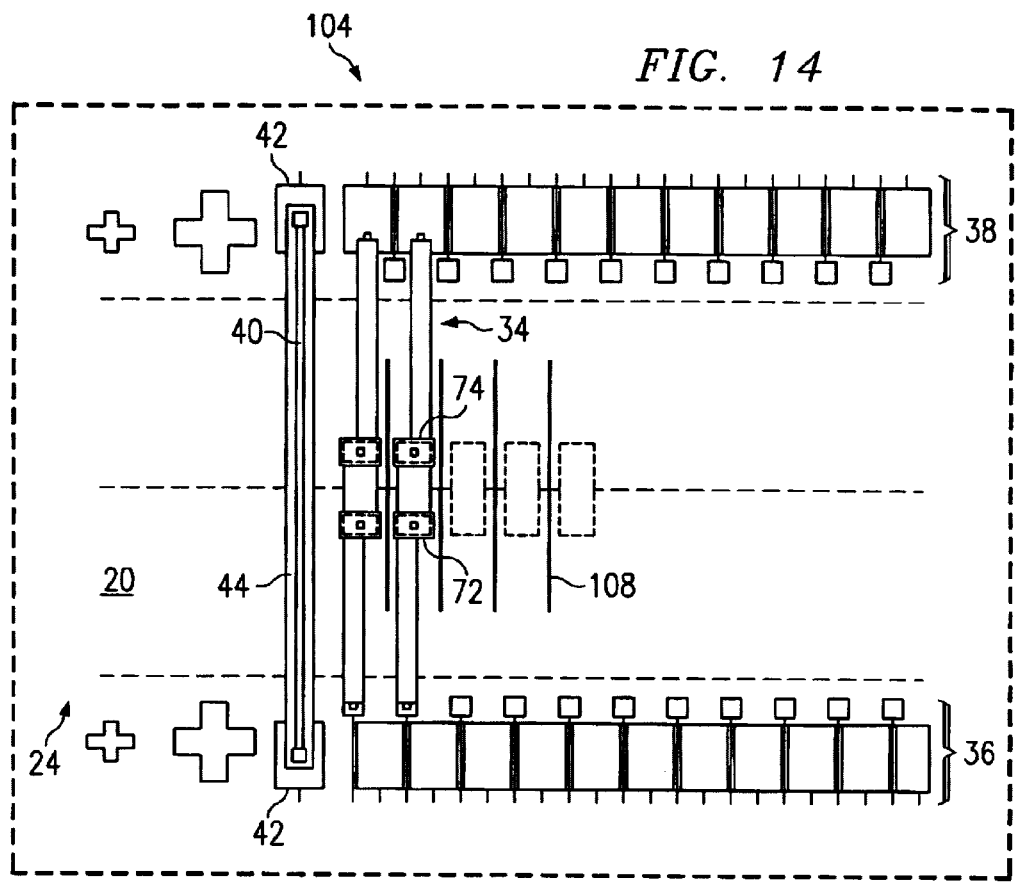
FIG. 14 is a top view of a linear array of infrared devices monolithically connected to the input gates of a readout circuit capable of detecting two wavelengths simultaneously according to another embodiment of the current invention.

FIG. 14 is a top view of a linear array 104 of infrared devices monolithically connected to the input gates 36, 38 of the ROIC 20. The detector array common contact 40 is shown as a vertical line on the left end of the array in FIG. 14 and connected to the ROIC common input gate 42. A similar common contact connection 42 exists on the right extreme of the array, but not shown in FIG. 14 since only a part of the entire array is shown here. FIG. 15 is a cross-sectional view of the monolithic infrared device shown in FIG. 14, and the process sequence is depicted in FIG.17.

As part of the manufacturing process, the entire ROIC 20 is covered with a protective encapsulant of silicon nitride or silicon dioxide as before. Consequently, a window 24 must be etched in the silicon nitride or silicon dioxide before infrared detector materials may be grown (FIG. 15 and FIG. 17A).

Figure 17A:
FIGS. 17(A) to 17(G) are the cross sectional views of the process steps for producing the monolithic infrared device of FIG. 14.
Figure 17B:
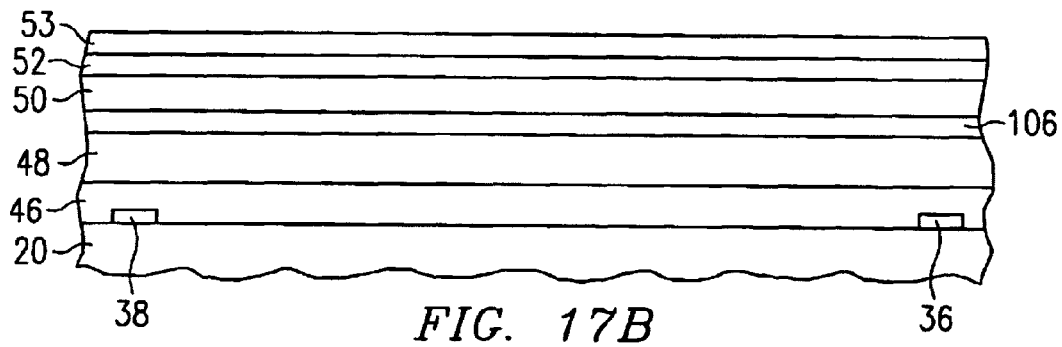

As shown in FIGS. 15 and 17B, successive layers of semi-conductive material are formed on the ROIC 20. First the buffer layer of CdTe 46 is grown, followed by the layer 48 of indium doped n-type HgCdTe suitable for detecting a first wavelength of infrared radiation. Next, an arsenic doped p-type HgCdTe layer 106 of about 2 $\mu$m is grown. Here the arsenic is incorporated in the HgCdTe layer 106 during the growth by MBE rather than by implantation as in the previous embodiment. Since the two HgCdTe layers 106 and 48 are of opposite conducting polarity (p-type and n-type respectively), the first p-n junction is formed between them that can be used to detect the first wavelength of infrared radiation. Next, an n-type HgCdTe layer 50 (indium doped during the growth) is grown to a thickness of about 10 $\mu$m with a band gap suitable for detecting a second wavelength of infrared radiation. Another HgCdTe layer 52 with band gap greater than that of the previous layer 50 is then grown followed by a thin CdTe 53 of about 200 nm. This wide band gap HgCdTe layer 52 reduces the surface leakage current as discussed in the previous embodiment.

The layered ROIC 20 is then annealed in an ampoule containing mercury overpressure to activate the arsenic. The annealing technique is the same as that described in the previous embodiment. This annealing gives rise to about $10^{17}/cm^3$ carriers in the arsenic doped layer 106 and about $10^{15}/cm^3$ in the indium doped n-type HgCdTe layers 48 and 50.

Figure 17C:
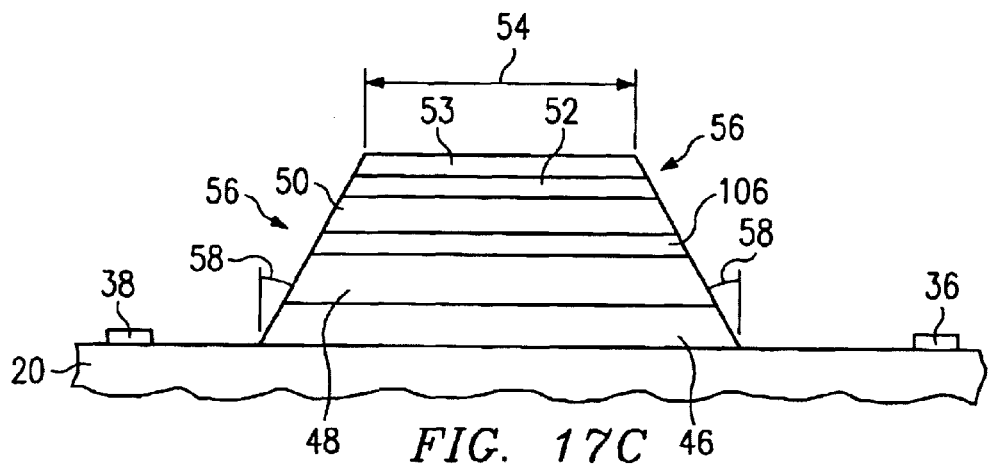
Figure 17D:
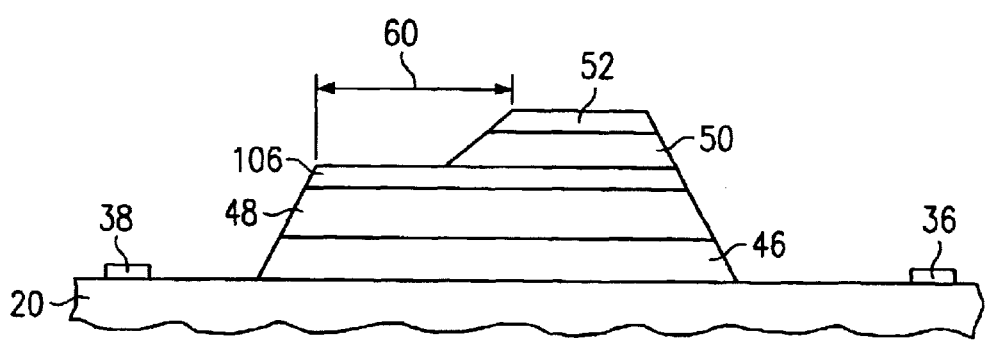

The entire material structure on the ROIC outside of window 24 is then chemically removed to expose the plurality of ROIC input gates 36 and 38 (FIG. 17a). The etchant is bromine in HBr (2%) and hence selectively removes only the HgCdTe and CdTe layers without affecting the ROIC 20. A mesa structure 54 is then selectively etched using photolithography, the cross section of which is shown in FIG. 17C. This is done by photolithography, selectively protecting the entire material under window 54 with photoresist and removing the material outside windows 54 by etching. In the other dimension, this mesa structure is continuous along the length of the ROIC array as before. The chemical etching producing the mesa forms slopes along the two sides adjacent to the plurality of ROIC input pads 36 and 38 in the material structure between the windows 24 and 54 (FIG. 17D). The details of the slope formation are the same as discussed in the previous embodiment. These slopes are needed to form the monolithic metal interconnect between the detector output and ROIC input later in the process.

Figure 17E:
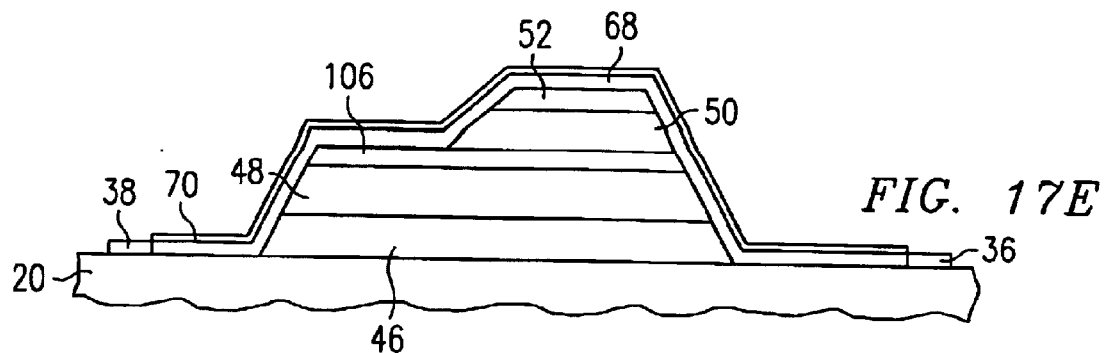

As shown in FIG. 17D, a window 60 within the window 54 is then opened by photolithography where the CdTe layer 53, HgCdTe layer 52, and HgCdTe layer 50 are chemically removed selectively by performing another step of photolithography. After removing the CdTe cap layer 53 from the rest of the sample, a fresh thin CdTe layer 68 of 200 nm thickness is re-grown, preferably by MBE, as shown in FIG. 17E. A ZnS layer 70 of about 200 nm is then grown. However, other methods like thermal and electron beam evaporation can also be used to perform this step without altering the results.

Figure 17F:
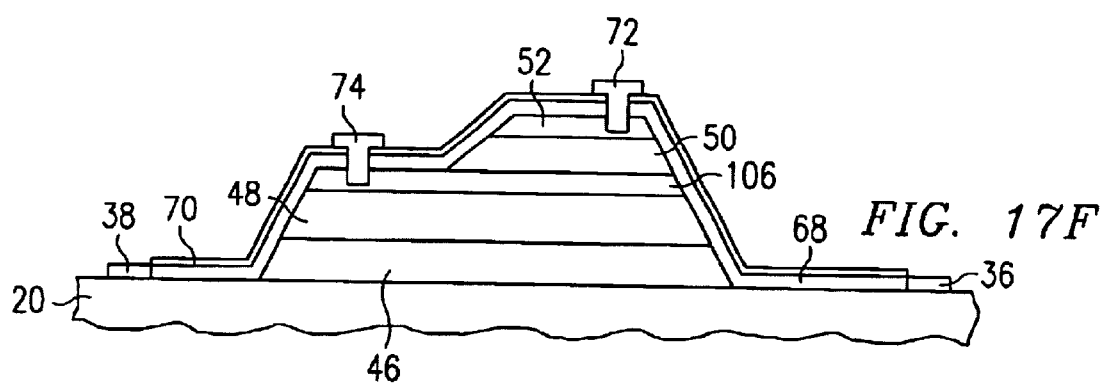

The sample is then coated with photoresist and a plurality of windows are opened in the CdTe layer 68 and ZnS layer 70 by performing photolithography. Gold metal is then selectively deposited in these window areas by photolithography and lift-off to create contacts 72, 74 as shown in FIG. 17F. A first wavelength of infrared radiation is detected by the first junction (between the p-HgCdTe 106 and n-HgCdTe 48) while infrared radiation of other wavelength passes through these layers and is detected by the second junction (between the p-HgCdTe 106 and n-HgCdTe 50).

Figure 17G:
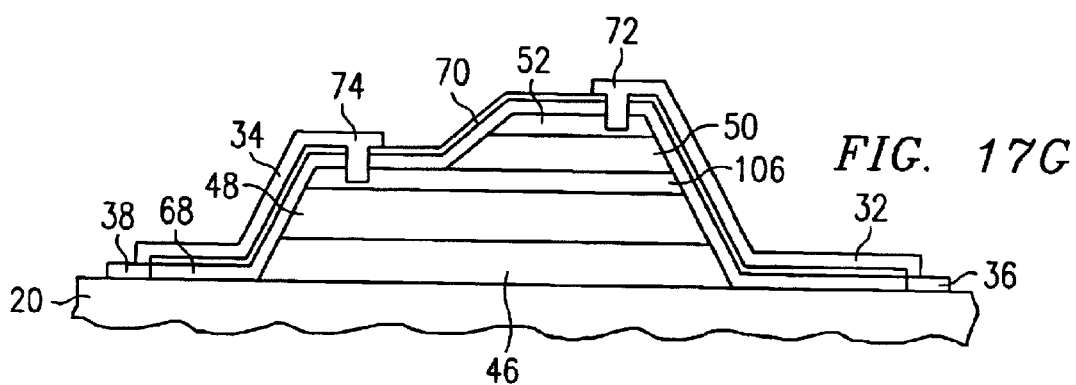

The detector common contact 40 is then formed at both ends of the plurality of detectors (a part of the array from the left end along with the common contact interconnect is shown in FIG. 14) and connected to the common contact 42 of the ROIC 20. The detector output 72 and 74 (FIGS. 14 and 15) are then connected to the corresponding signal input gates 36 and 38 of the ROIC 20 by the monolithic interconnects 32 and 34 as shown in FIG. 17G.

Figure 16:
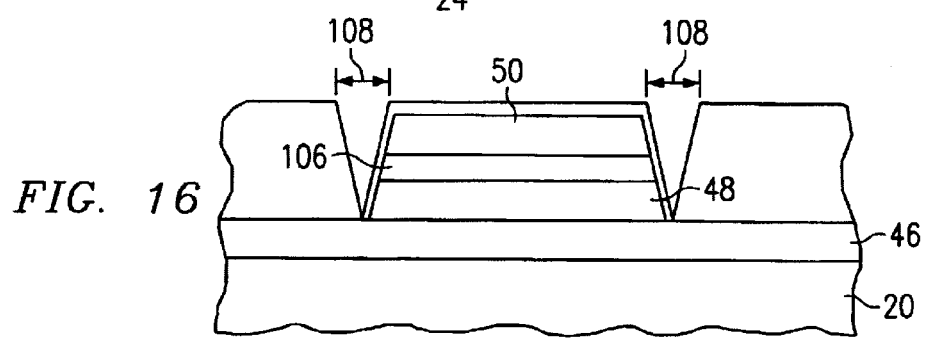
FIG. 16 is a cross-sectional view showing the device isolation etch areas performed by dry etching.

Turning now to FIG. 16, grooves 108 are etched using dry etching methods like plasma ecthing to ensure device isolation. Note that the etching depth is limited to a part of the HgCdTe layer 8 thickness (about 70% of this layer is etched off in the grooves 108). The completed (FIGS. 15 and 17G) could then be encapsulated with a ZnS or CdTe layer.

While various embodiments of the present invention have been shown and described, it should be understood that other modifications, substitutions and alternatives could be made without departing from the spirit and scope of the invention, which should be determined from the appended claims.

What is claimed is:

1. An infrared sensing device, comprising:
   a readout integrated circuit formed in a face of a silicon substrate;
   a Group II–VI semiconductor multi-layer epitaxially grown on said face;
   at least one mesa formed from said Group II–VI semiconductor multi-layer;

a plurality of infrared detecting cells formed in said mesa;

each said infrared detecting cell responding to a different infrared wavelength; and a conductor interconnect layer connecting said detection cells to said readout integrated circuit.

2. The infrared sensing device according to claim 1, wherein:

said mesa includes at least two layers of Group II–VI semiconductor material having different band gaps;

a first said infrared detecting cell being electrically connected to a signal input gate in said readout integrated circuit; and a second said infrared detecting cell being electrically connected to a signal input gate in said readout integrated circuit.

3. The infrared sensing device according to claim 1, wherein:

said mesa has first and second sloped sides;

a first conductive trace formed on one of said sloped sides of said mesa, said first conductive trace connecting a first detector output of said first infrared detecting cell and a first input of said readout integrated circuit; and a second conductive trace formed on another of said sloped sides of said mesa, said second conductive trace connecting a second detector output of said second infrared detecting cell and a second input of said readout integrated circuit.

4. The infrared sensing device according to claim 3, wherein:

said first detector output is formed on a different plane than said first input of said readout integrated circuit; and said second detector output is formed on a different plane than said second input of said readout integrated circuit.

5. A two color Infrared sensing device comprising:

a readout integrated circuit formed at a face of a semiconductor silicon substrate having a tilt of approximately one degree from a 100 crystal direction;

a mesa epitaxially grown on the face of the silicon integrated circuit substrate, said mesa including:

a buffer layer;

a first layer of Group II–VI semiconductor material having a first band gap on said buffer layer; said buffer layer functionally reducing mismatch between said silicon integrated readout circuit substrate and said first layer of Group II–VI semiconductor material;

a second layer of Group II–VI semiconductor material disposed on said first layer of Group II–VI semiconductor material, said second layer of Group II–VI semiconductor material having a second band gap different from said first band gap;

a third layer of Group II–VI semiconductor material disposed on said second layer of Group II–VI semiconductor material, said third layer of Group II–VI semiconductor material having a band gap different from said second band gap;

said first and third Group II–VI layers having same conducting polarity a conductivity type which is opposite to a conducting polarity the conductivity type of said second Group II–VI layer;

a first infrared detecting cell with a p-n junction formed between said first and second Group II–VI layers; and a second infrared detecting cell with a p-n junction formed between said second and third Group II–VI layers.

6. The infrared sensing device according to claim 5, wherein said first layer of Group II–VI semiconductor material is formed of indium doped n-type HgCdTe.

7. The infrared sensing device according to claim 6, wherein said second layer of Group II–VI semiconductor material is formed of arsenic doped p-type HgCdTe.

8. The infrared sensing device according to claim 5, wherein:

said mesa has first and second sloped sides;

a first conductive trace formed on said first sloped side connecting a first detector output of said first infrared detecting cell and a first input of said readout integrated circuit;

a second conductive trace formed on said second sloped side connecting a second detector output of said second infrared detecting cell and a second input of said readout integrated circuit.

9. The infrared sensing device according to claim 8, wherein:

said first detector output is formed on a different plane than said first input of said readout integrated circuit;

said second detector output is formed on a different plane than said second input of said readout integrated circuit; and said first and second sloped sides have a slope angle relative to a horizontal plane between about 40 and 50 degrees.

10. A two-color infrared sensing device, comprising:

a readout integrated circuit formed in a face of a silicon substrate, the face having a tilt of at least one degree from a crystal direction;

a mesa epitaxially grown on the face and including a buffer layer, a first layer of Group II–VI semiconductor material having a first conductivity type and a first bandgap, the first layer being disposed on the buffer layer, the buffer layer functionally reducing mismatch between the silicon substrate and the first layer;

the mesa further including a second layer of Group II–VI semiconductor material having the first conductivity type and a second bandgap different from the first bandgap, the second layer disposed on the first layer;

a first detector cell region of a second conductivity type opposite the first conductivity type formed to extend into the first layer; and a second detector cell region of the second conductivity type, the second detector cell region spaced from the first detector cell region and formed to extend into the second layer.

11. The sensing device of claim 10, wherein the first and second layers are formed of alloys of mercury, cadmium and tellurium and are doped with arsenic to be (p) type or indium to be (n) type.

* * * * *